(12) United States Patent
Tabery et al.

(10) Patent No.: US 7,207,017 B1
(45) Date of Patent: Apr. 17, 2007

(54) METHOD AND SYSTEM FOR METROLOGY RECIPE GENERATION AND REVIEW AND ANALYSIS OF DESIGN, SIMULATION AND METROLOGY RESULTS

(75) Inventors: Cyrus Tabery, Santa Clara, CA (US); Chris Haidinyak, Santa Cruz, CA (US); Todd P. Lukanc, San Jose, CA (US); Luigi Capodieci, Santa Cruz, CA (US); Carl P. Babcock, Campbell, CA (US); Hung-eil Kim, San Jose, CA (US); Christopher A. Spence, Los Altos, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 359 days.

(21) Appl. No.: 10/865,047

(22) Filed: Jun. 10, 2004

(51) Int. Cl.
*G06F 17/50* (2006.01)
(52) U.S. Cl. ........................................................ 716/4
(58) Field of Classification Search ...................... 716/4
See application file for complete search history.

(56) References Cited

U.S. PATENT DOCUMENTS

| | | | |
|---|---|---|---|
| 6,415,421 B2 | 7/2002 | Anderson et al. | 716/4 |
| 6,425,113 B1 | 7/2002 | Anderson et al. | 716/5 |
| 6,510,730 B1 | 1/2003 | Phan et al. | 73/105 |
| 6,523,162 B1 | 2/2003 | Agrawal et al. | 716/19 |
| 6,823,496 B2 * | 11/2004 | Bergman Reuter et al. | 716/4 |
| 2003/0229410 A1 * | 12/2003 | Smith et al. | 700/109 |
| 2004/0102934 A1 * | 5/2004 | Chang | 703/1 |

* cited by examiner

*Primary Examiner*—Jack Chiang
*Assistant Examiner*—Brandon W. Bowers
(74) *Attorney, Agent, or Firm*—Renner, Otto, Boisselle and Sklar, LLP

(57) ABSTRACT

A method of generating a metrology recipe includes identifying regions of interest within a device layout. A coordinate list, which corresponds to the identified regions of interest, can be provided and used to create a clipped layout, which can be represented by a clipped layout data file. The clipped layout data file and corresponding coordinate list can be provided and converted into a metrology recipe for guiding one or more metrology instruments in testing a processed wafer and/or reticle. The experimental metrology results received in response to the metrology request can be linked to corresponding design data and simulation data and stored in a queriable database system.

25 Claims, 6 Drawing Sheets

METHOD AND SYSTEM FOR METROLOGY RECIPE GENERATION AND REVIEW AND ANALYSIS OF DESIGN, SIMULATION AND METROLOGY RESULTS

TECHNICAL FIELD

The present invention relates generally to the field of integrated circuit device design and manufacture and, more particularly, to a method and system for metrology recipe generation and review and analysis of design, simulation and metrology results.

BACKGROUND

In designing an integrated circuit (IC) device, engineers or designers typically rely on computer design tools to help create an IC schematic or design, which can include a multitude of individual devices, such as transistors, coupled together to perform a certain function. To actually fabricate the IC device in or on a semiconductor substrate, the IC device schematic must be translated into a physical representation or layout, which itself can be transferred onto the surface of the semiconductor substrate. Computer-aided design (CAD) tools can be used to assist layout designers with translating the discrete circuit elements into shapes, which will embody the devices themselves in the completed IC device. These shapes make up the individual components of the circuit, such as gate electrodes, diffusion regions, metal interconnects and the like.

The software programs employed by the CAD systems to produce layout representations are typically structured to function under a set of predetermined design rules in order to produce a functional circuit. Often, the design rules are determined by certain processing and design limitations based roughly on the patternability of layout designs. For example, design rules may define the space tolerance between devices or interconnect lines.

Once the layout of the circuit has been created, the next step to manufacturing the IC device is to transfer the layout onto a semiconductor substrate. Optical lithography or photolithography is a well-known process for transferring geometric shapes onto the surface of a semiconductor wafer. The photolithography process generally begins with the formation of a photoresist layer on the top surface of a semiconductor substrate or wafer (or some intermediate layer). A reticle or mask having light non-transmissive opaque regions, which are often formed of chrome, and light transmissive clear regions, which are often formed of quartz, is then positioned over the photoresist-coated wafer.

The mask is placed between a radiation or light source, which produces light of a pre-selected wavelength (e.g., ultraviolet light) and geometry, and an optical lens system, which may form part of a stepper or scanner apparatus. When light from the light source is directed onto the mask, the light is focused to generate a reduced mask image on the wafer, typically using the optical lens system, which contains one or several lenses, filters and/or mirrors. The light passes through the clear regions of the mask to expose the underlying photoresist layer and is blocked by the opaque regions of the mask, leaving the underlying portion of the photoresist layer unexposed. The exposed photoresist layer can then be developed, typically through chemical removal of the exposed or unexposed regions of the photoresist layer. The end result is a semiconductor wafer coated with a photoresist layer exhibiting a desired pattern, which defines geometries, features, lines and shapes of that layer. This pattern can then be used for etching underlying regions of the wafer.

Once a wafer of IC devices is manufactured, experimental testing and/or inspection of the manufactured devices can be performed to verify that the manufactured devices are within specification limits set by the device design and/or layout. This testing, which is commonly referred to as metrology, can include obtaining critical dimension (CD) measurements of structures across the device, obtaining scanning electron microscopy (SEM) images of various regions across the device as well as other optical and electrical measurements.

Currently, there is no convenient way to assign errors detected during metrology (wafer metrology or reticle metrology) to a specific location within the layout. For example, a SEM image may show a defect within a structure on the patterned wafer. However, the corresponding location within the layout cannot be determined without considerable time and expense. Further, there is non-coordination of locations across the various spaces involved in IC device design, manufacture and testing (i.e., circuit design, circuit layout, reticle manufacture, and wafer patterning). Therefore, when an error is detected during metrology, there is no practical way to trace it across the different spaces involved in IC device design and manufacture.

Further, in an effort to continue device downscaling, and as IC device design and manufacture technology progresses and is further automated, the user can be presented with prodigious amounts of data, including parametric design rule variation test layouts, optical proximity correction (OPC) and optical rule checking (ORC) simulation results, and metrology test results. Currently, there is no way to efficiently process or otherwise link all of this data, which results in incomplete characterization of the manufacturability of a given process.

Accordingly, a need exists in the art for an improved method and system for metrology recipe generation and review and analysis of design, simulation and metrology results.

SUMMARY OF THE INVENTION

According to one aspect of the invention, the invention is directed to a method of generating a metrology recipe. The method can include identifying regions of interest within a device layout and creating a table of coordinates corresponding to the identified regions of interest. At least a portion of the device layout and the table of coordinates can be outputted to at least one metrology device.

According to another aspect of the invention, the invention is directed to a program embodied in a computer-readable medium to automatically generate a metrology recipe. The program can include code that identifies regions of interest within a device layout and code that creates a table of coordinates corresponding to the identified regions of interest. The program can also include code that creates a clipped layout data file, where clipped layout data file includes layout data representative of the identified regions of interest within the locations corresponding to the table of coordinates, and code that converts the clipped layout data file and the table of coordinates into a metrology recipe.

According to another aspect of the invention, the invention is directed to a method of designing an integrated circuit (IC) device. The method can include generating a layout corresponding to an IC device design and simulating how structures within the layout will pattern on a wafer. Regions of interest within the layout can be identified and a coordinate list can be created, where the coordinate list corresponds to locations within the layout of each region of interest. A clipped layout file can be created and the clipped layout file and the coordinate list can be converted into a metrology recipe, which can be sent to at least one metrology tool.

According to another aspect of the invention, the invention is directed to a queriable database system for controlling and storing data related to integrated circuit (IC) device design and manufacture. The database system can store and link design data, simulation data and experimental data. The design, simulation and experimental data are coordinated based on data indicative of a physical representation of the design data.

These and other features of the invention are fully described and particularly pointed out in the claims. The following description and annexed drawings set forth in detail certain illustrative embodiments of the invention, these embodiments being indicative of but a few of the various ways in which the principles of the invention may be employed.

BRIEF DESCRIPTION OF DRAWINGS

These and further features of the present invention will be apparent with reference to the following description and drawings, wherein.

DISCLOSURE OF INVENTION

Figure 1:
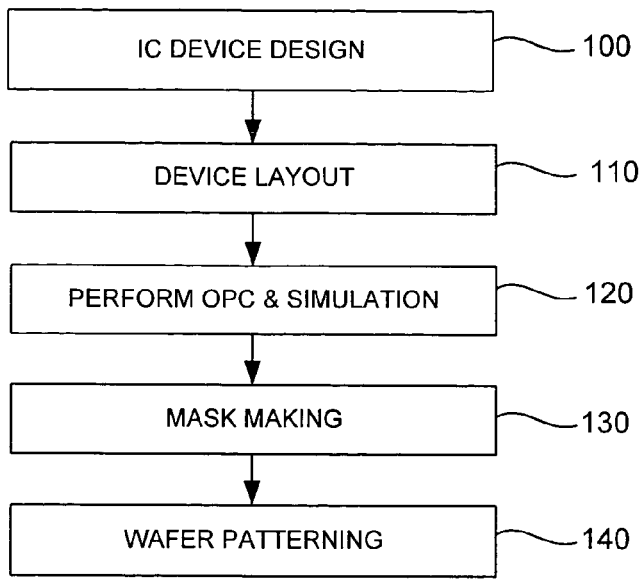
FIG. 1 is a production flow diagram of an exemplary process for producing an IC device.

In the detailed description that follows, corresponding components have been given the same reference numerals regardless of whether they are shown in different embodiments of the present invention. To illustrate the present invention in a clear and concise manner, the drawings may not necessarily be to scale and certain features may be shown in somewhat schematic form.

One aspect of the present invention includes a method of generating a metrology recipe. A plurality of regions of interest within a device layout can be identified. A coordinate list corresponding to the identified regions of interest can be provided and used to create a clipped layout, which can be represented by a clipped layout data file. The clipped layout data file and corresponding coordinate list can be provided and automatically converted into a metrology recipe for guiding one or more metrology operations on a processed wafer and/or reticle. The method of generating a metrology recipe can be automated and can facilitate automated metrology procedures.

Another aspect of the present invention includes linking the generation of the metrology recipe with the experimental metrology results provided in response to the metrology request in a queriable database. The queriable database can include design data, simulation data and experimental data linked to one another in terms of a central coordinate system based upon the layout or physical representation of the IC device. The queriable database allows searching for optimality with respect to simulation results and/or experimental results based on design attribute information, process conditions, and/or lithography conditions.

The present invention will be described herein in the exemplary context of the design and manufacturing process for ultimately patterning a semiconductor layer (e.g., polysilicon) that forms a part of an integrated circuit (IC) device. Exemplary IC devices can include general use processors made from thousands or millions of transistors, a flash memory array, SRAM (static random-access memory) cells or any other dedicated circuitry. However, one skilled in the art will appreciate that the methods and systems described herein can also be applied to the design process and/or manufacture of any article manufactured using photolithography, such as micromachines, disk drive heads, gene chips, microelectro-mechanical systems (MEMS) and the like. Further, it will be appreciated that the methods and systems described herein can be applied to other patterning techniques, including, but not limited to, electron beam lithography, imprint lithography, ion beam lithography and laser ablation.

FIG. 1 illustrates an exemplary production flow diagram for producing an IC device. It is to be appreciated that each of the steps depicted in FIG. 1 can include associated data sets and/or databases of design parameters, mask design parameters, exposure conditions, process conditions, experimental results and measurements and the like. As is discussed more fully below, the data sets and/or databases associated with each of the steps in the production flow of FIG. 1 can be linked in a queriable database system. The general production flow depicted in FIG. 1 is relatively well-known and, therefore, will not be described in great detail. Step 100 includes receiving, providing or otherwise generating an IC device design, which can be embodied in a high-level "netlist" description. At step 110, the device design can be converted or otherwise translated into a physical representation or layout. At step 120, optical proximity correction (OPC) and simulation can be performed on the device layout to improve image fidelity. At step 130, the layout data can be converted to or otherwise represented as reticle data for use in mask making. Once the appropriate mask is made at step 130, the wafer can be patterned at step 140 (including many repeated patterning, etching, deposition and polishing steps), thereby providing a manufactured IC device.

Figure 2:
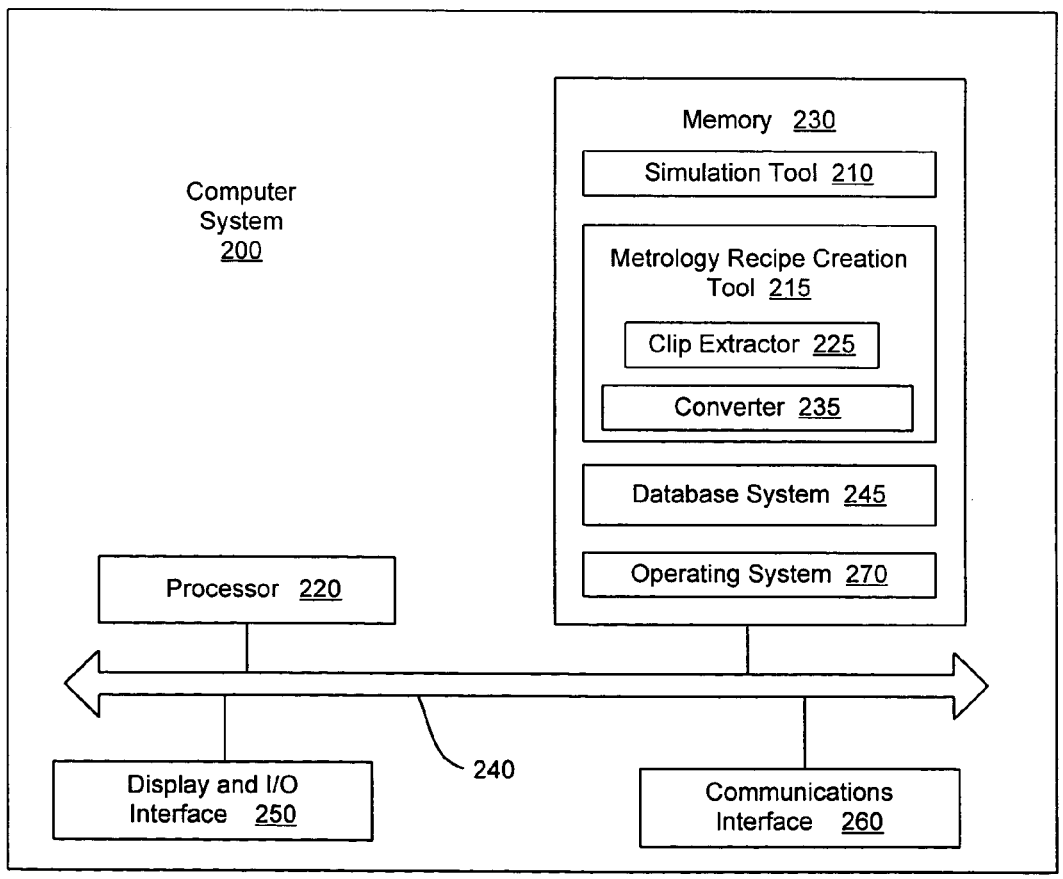
FIG. 2 is a schematic block diagram of a computer system capable of executing a metrology recipe generation tool and a queriable database system in accordance with the present invention.

Turning now to FIG. 2, a schematic block diagram of a computer system 200 capable of executing a simulation tool 210, a metrology recipe creation tool 215 and a queriable database system 245 in accordance with the present invention is illustrated. As is described more fully below, the metrology recipe creation tool 215 can include a clip extractor 225 and a converter 235. As indicated, the metrology recipe creation tool 215 can be used to generate one or more metrology recipes or requests. Further, the results of the metrology requests can be linked together along with corresponding design data and simulation data in the queriable database 245. In one embodiment, the clip extractor 225 and the converter 235 are embodied as separate computer programs (e.g., software applications including a compilation of executable code). Alternatively, the clip extractor 225 and converter 235 can be embodied as a single computer program or application.

To execute the metrology recipe creation tool 215 (including the clip extractor 225 and the converter 235) and the queriable data system 245, the computer system 200 can include one or more processors 220 used to execute instructions that carry out specified logic routines. In addition, the computer system 200 can include a memory 230 for storing data, software, logic routine instructions, computer programs, files, database systems, operating system instructions, and the like. The memory 230 can comprise several devices and includes, for example, volatile and non-volatile memory components. As used herein, the memory 230 can include, for example, random access memory (RAM), read-only memory (ROM), hard disks, floppy disks, compact disks (e.g., CD-ROM, DVD-ROM, CD-RW, etc.), tapes, and/or other memory components, plus associated drives and players for these memory types. The processor 220 and the memory 230 are coupled using a local interface 240. The local interface 240 can be, for example, a data bus, accompanying control bus, a network, or other subsystem.

The computer system 200 can include various video and input/output interfaces 250 as well as one or more communications interfaces 260. The interfaces 250 can be used to couple the computer system 200 to various peripherals and networked devices, such as a display (e.g., a CRT display or LCD display), a keyboard, a mouse, a microphone, a camera, a scanner, a printer, a speaker, and so forth. The communications interfaces 260 can be comprised of, for example, a modem and/or network interface card, and can enable the computer system 200 to send and receive data signals, voice signals, video signals, and the like via an external network, such as the Internet, a wide area network (WAN), a local area network (LAN), direct data link, or similar wired or wireless system.

The memory 230 can store an operating system 270 that is executed by the processor 220 to control the allocation and usage of resources in the computer system 200. Specifically, the operating system 270 controls the allocation and usage of the memory 230, the processing time of a processor 220 dedicated to various applications being executed by the processor 220, and the peripheral devices, as well as performing other functionality. In this manner, the operating system 270 serves as the foundation on which applications, such as the metrology recipe generation tool 215 and the queriable database system 245, depend, as is generally known by those of ordinary skill in the art.

Figure 3:
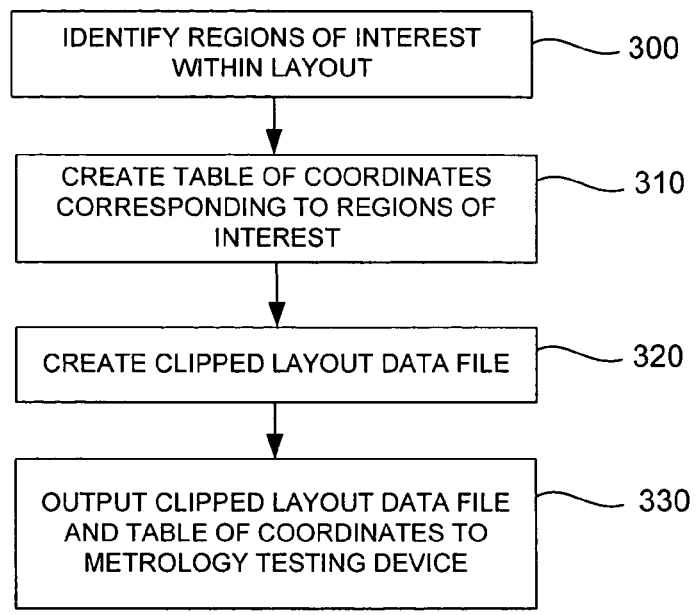
FIG. 3 is a flow chart illustrating a method of generating a metrology recipe in accordance with the present invention.

With reference now to FIG. 3, one embodiment of a method of generating a metrology recipe is provided. The flow chart of FIG. 3 can be thought of as depicting steps of a method implemented on or with the assistance of the computer system 200 of FIG. 2.

The method, as specified by the metrology recipe creation tool 215, can begin at step 300 with identifying regions of interest within a device layout. In one embodiment, regions of interest within the layout can be identified using an appropriate simulation tool 210, which performs optical rule checking (ORC). The simulation tool 210 can tag or otherwise identify regions including structures that are not within predefined specification limits and/or are marginally within predefined specification limits. In other words, the simulation tool 210 can identify potentially problematic regions within the device layout. In addition, portions of the layout can be identified based upon design attribute information, such as portions or regions of the layout that contain critical features. In addition, portions or regions of the layout that contain test structures (i.e., test structures inserted into one or more locations within the layout, such as is the case when designing for metrology) can be identified at step 300.

Once the regions of interest within the layout are identified (step 300), a table of coordinates or sites corresponding to the regions of interest can be created at step 310. In one embodiment, the table of coordinates can include the coordinate locations of the regions of interest as well as boxes or cells containing the regions of interest. At step 320, a clipped layout data set or data file can be created based on the initial layout as well as the table of coordinates. In one embodiment, the clipped layout data file can be formed by clipping or otherwise selectively extracting layout data from the initial layout data set in order to create a new layout data file.

Figure 7:
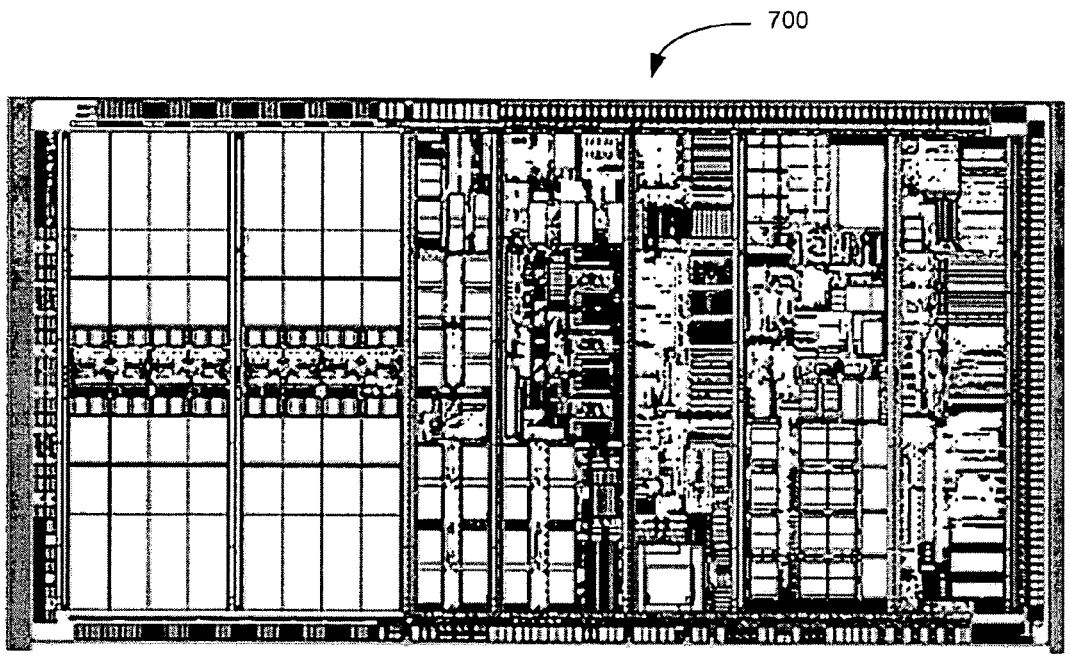
FIG. 7 is a schematic diagram of an exemplary device layout represented by full layout data set.
Figure 8:
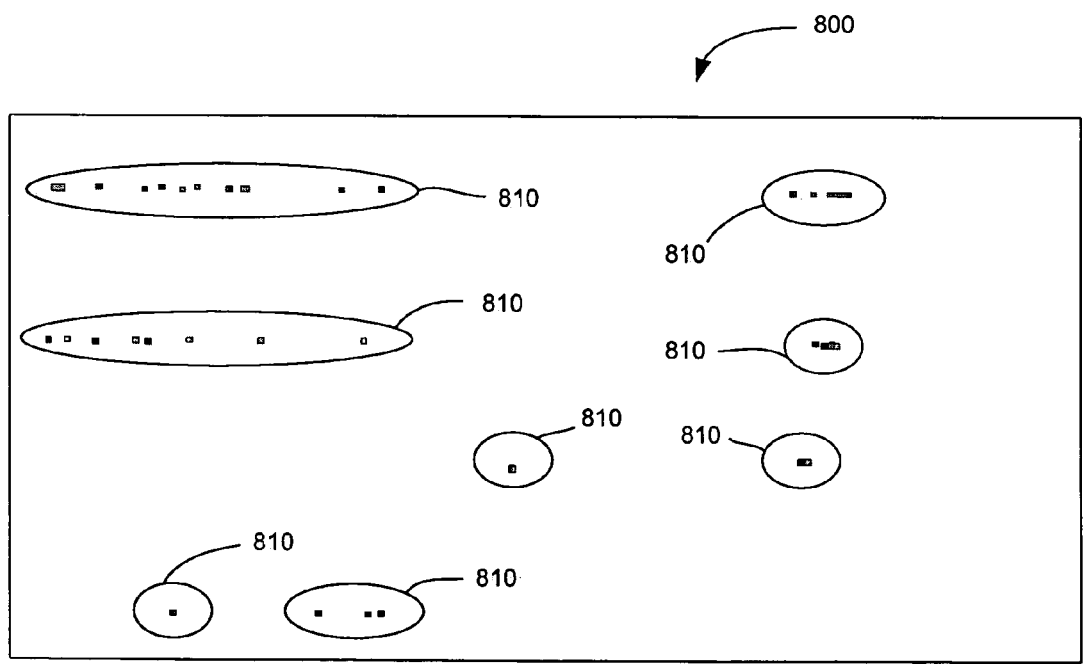
FIG. 8 is a schematic diagram of an exemplary clipped device layout, which corresponds to the exemplary device layout of FIG. 7, represented by a clipped layout data set.

The clipped layout data set will be representative of a clipped layout, which includes portions of the layout identified at step 300 in the coordinate locations corresponding to the table of coordinates (step 310). All other space within the clipped layout (and corresponding clipped layout data file) will be blank or empty. In one embodiment, once the full device layout has been clipped, coordinates of every feature (e.g., every edge) within each clipped can be extracted and used in processing. FIG. 7 illustrates an exemplary full device or full chip layout 700, while FIG. 8 illustrates a corresponding exemplary clipped layout 800. As shown, the clipped layout 800 of FIG. 8 includes a plurality of regions of interest 810 assigned to locations as set forth in a corresponding exemplary coordinate list.

At step 330, the clipped layout data set and the corresponding table of coordinates can be output or otherwise transmitted to the appropriate metrology testing device. Optionally, each region of interest within the clipped layout can be simulated, such simulations also being transmitted along with the clipped layout data set and table of coordinates to the appropriate metrology testing device. This combination of coordinate locations, both on the wafer itself and within single devices (or function aspects of single devices), along with the clipped layout data file can be thought of as the metrology recipe or request. As is described more fully below, the methodology described herein can be effective for generating wafer and reticle metrology recipes. Further, metrology recipes or requests can be generated for output to any type of metrology instrument or tool, including, but not limited to, optical metrology tools, electrical testing tools, microscopy tools and the like.

Figure 4:
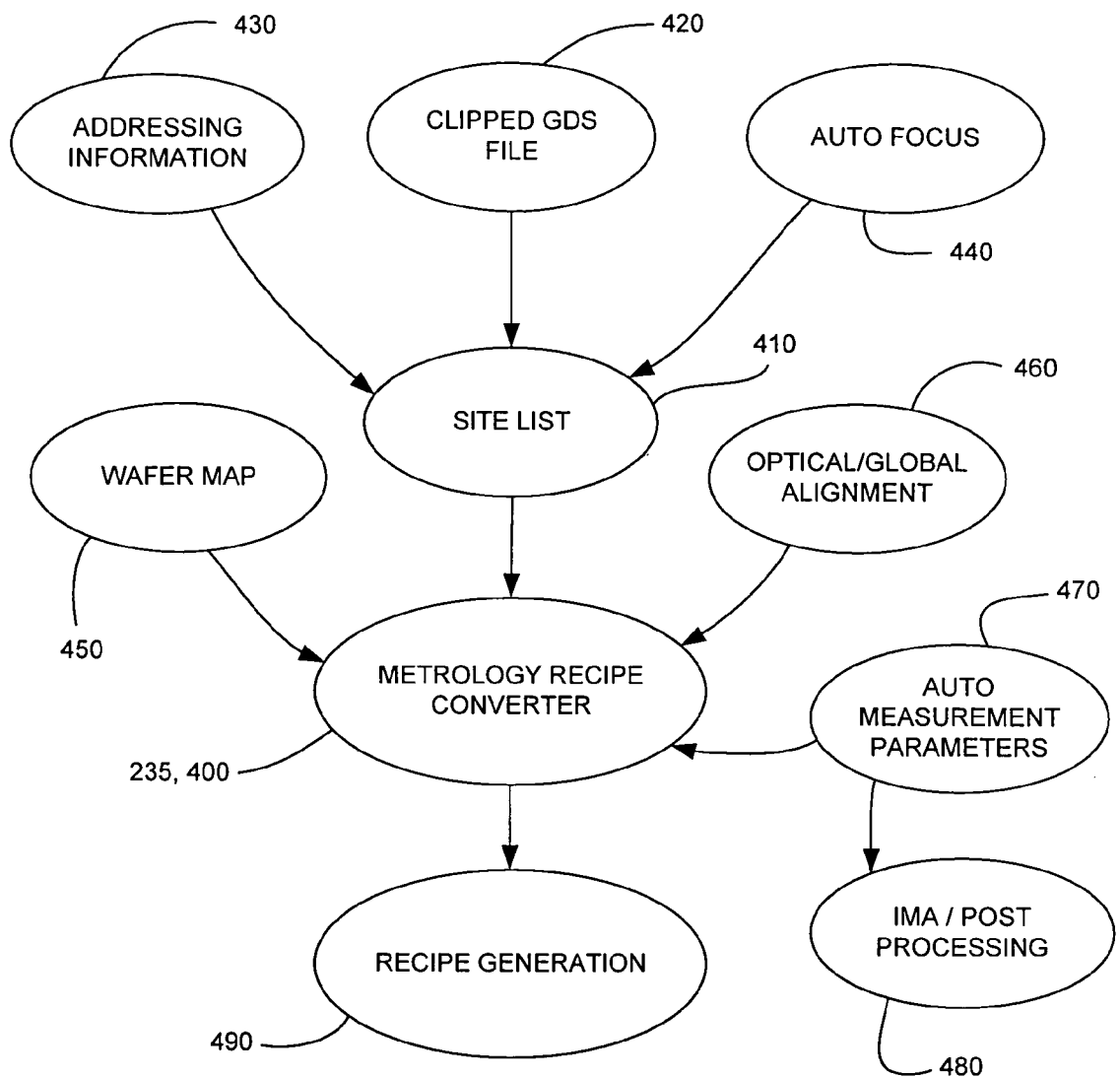
FIG. 4 is a schematic diagram illustrating a database architecture for automated metrology recipe generation in accordance with the present invention.

With reference now to FIG. 4, a schematic diagram of a database architecture for automated metrology recipe generation is provided. FIG. 4 schematically illustrates a plurality of databases, which each provide text and/or XML files into a converter 235, 400. It is to be appreciated that the inclusion or exclusion of some of the illustrated files will depend on the type of metrology recipe being generated (i.e., whether the metrology recipe pertains to optical metrology, electrical metrology, acquisition of scanning electron microscopy (SEM) images, reticle metrology and the like).

As described above, a coordinate or site list 410, which includes coordinates for regions of interest (as well as features or structures within those regions of interest), can include the clipped layout data file or clipped GDS file 420, appropriate addressing information or files 430 (e.g., addressing information needed to perform pattern recognition off-site in connection with SEM measurements) and auto focus information or files 440. In addition, the converter 400 can receive appropriate wafer map information or files 450 (also known as wafer ID information) and optical or other appropriate global alignment information or files 460. Optionally, the converter 400 can receive auto measurement parameter (AMP) files 470 (after image metrology automation (IMA) and post processing 480 have occurred). The converter 400 can process these files in order to generate an appropriate metrology recipe 490 that can be provided, for example, in a vendor proprietary binary format. In short, the converter 400 performs a conversion of all of the relevant input information into a metrology recipe file for use by a metrology tool (i.e., all necessary information is provided in structured ASCII/XML files and then converted into an actual metrology recipe for a metrology instrument).

Figure 5:
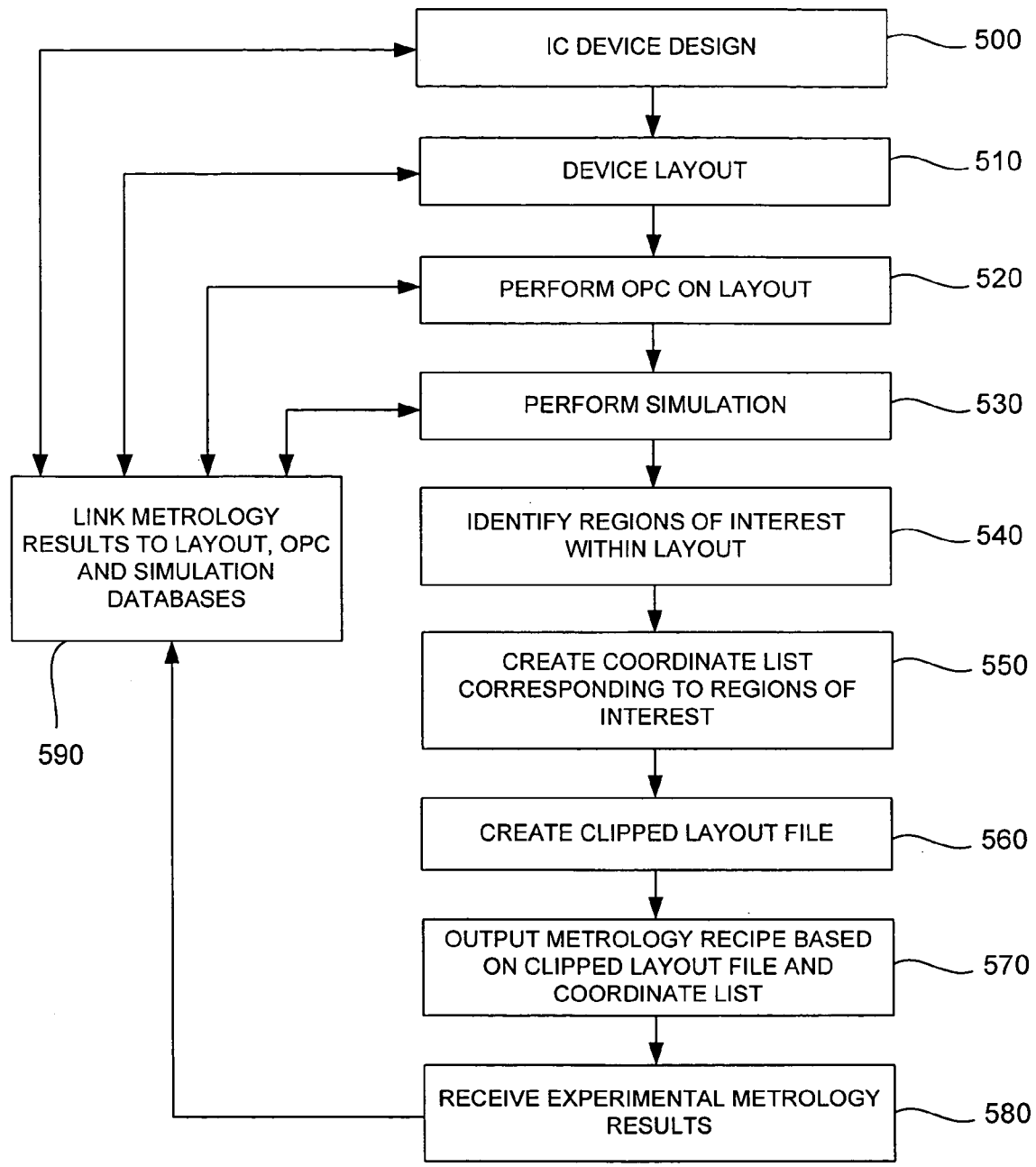
FIG. 5 is a flow chart illustrating a method of designing an IC device in accordance with the present invention.

With reference now to FIG. 5, one embodiment of a method of designing an integrated circuit (IC) device is provided. The flow chart of FIG. 5 can be thought of as depicting steps of a method implemented on or with the assistance of the computer system 200 of FIG. 2.

The method can begin at step 500 where an IC device design or schematic is provided by an engineer or designer. Alternatively, the IC device design can be received from an outside source for processing in a manner described herein. It is to be appreciated that, in one embodiment, exemplary IC devices can include general use processors made from thousands or millions of transistors, a flash memory array, SRAM (static random-access memory) cells or any other dedicated circuitry. The designer can provide or otherwise design an IC device having a desired set of performance specifications and/or electrical characteristics. The IC device design can be embodied in a high-level description, commonly referred to as a "netlist." The netlist can be described in languages, such as VHDL and Verilog®, for example.

At step 510, the IC device design can be converted or otherwise translated into a physical representation or layout representation (also referred to simply as a layout). The layout can define the specific dimensions of the gates, isolation regions, interconnects, contacts, and other device elements that form the physical structures within the device design. These can be represented by a variety of shapes, polygonal, curvilinear and the like.

In one embodiment, the device layout can be generated or otherwise produced in accordance with a predetermined set of design rules. It is to be appreciated that the design rules can be determined by certain processing and/or design limitations, based on the patternability and/or manufacturability of layout designs. For example, the design rules can define the space tolerance between adjacent structures or devices, interconnect lines and the like. In addition, the design rules can include constraints on layer-to-layer relationships between, for example, active, metal and polysilicon layers.

The device layout can be embodied in a layout data file or data set (also referred to as a target database). The layout data file can include data layers that correspond to the actual layers to be fabricated in the IC device. The layout data file can also include cells, which define sets of particular devices within the circuit or IC device design. A cell can include all of the shapes on all of the layers required for the fabrication of the devices it contains. It is to be appreciated that cells can be nested or otherwise contained within other cells, often in very intricate arrangements. The structure of cells is commonly referred to as a data hierarchy. Typical formats for the shapes of a layout data file or target database are GDS, GDS II or CIF.

At step 520, optical proximity corrections (OPC) can be performed on the device layout in order to improve image fidelity. In general, OPC techniques involve running a computer simulation that takes an initial data set, having information related to the desired pattern or layout, and manipulates the data set to arrive at a corrected data set in an attempt to compensate for one or more of reticle/mask pattern fidelity, optical proximity effects and photoresist processing. Briefly, the OPC process can be governed by a set of geometric rules (i.e., "rule-based OPC" employing fixed rules for geometric manipulation of the data set), a set of modeling principles (i.e., "model-based OPC" employing predetermined behavior data to drive geometric manipulation of the data set) or a hybrid combination of rule-based OPC and model-based OPC.

The computer-implemented OPC process can involve iteratively refining the layout data set using, for example, an edge placement error value as a benchmark for the compensating or correcting process. That is, the layout data set can be manipulated based on the rules and/or models and the predicted placement of the edges contained in the pattern can be compared against their desired placement. For each edge or segment thereof, depending on how the edges are fragmented in the data set, a determination of how far the predicted edge segment placement deviates from the desired location can be derived. For instance, if the predicted edge placement corresponds to the desired location, the edge placement error for that edge will be zero.

At step 530, the device layout, before or after OPC correction (step 520), can be simulated. Simulating the device layout can include producing or otherwise generating a simulation image, which corresponds to a simulation of an image that would be printed on a wafer if the wafer was exposed to an illumination source directed through a mask including the device layout. Alternatively, the simulation image can correspond to a simulation of a photoresist layer that would be patterned according to exposure to an illumination source directed through a mask including the device layout. As such, the real pattern of structures within the device layout can be simulated as a result of one or more of resolution enhancement technologies (RET), OPC, proximity to other structures, density, corner rounding, as well as any other parameters that can alter the final image (i.e., the wafer image) as compared to the drawn layout. In addition, the wafer image can also be evaluated with respect to exposure and/or focus variations or other process variations that may alter or otherwise shift the edge placement of structures within the layout with respect to the "target image."

The layout can be simulated using one of a variety of commercially available simulation tools, such as, for example, CALIBRE® from Mentor Graphics Corp. Such simulation tools are useful for simulating or otherwise predicting how structures within the device layout will actually pattern and/or what manufacturing defects may occur during lithographic processing.

It is to be appreciated that steps 520 and 530 can be performed together (i.e., the layout simulation can include OPC routines to manipulate the layout data set as well as to predict how the layout data set will pattern on a wafer). Artisans will appreciate that the device design (step 500), the device layout (step 510), and/or the OPC (step 520) may be adjusted based on feedback received during the simulation (step 530).

Proceeding now to step 540, regions of interest within the layout can be identified. In one embodiment, regions of interest within the layout can be identified based on the simulation (step 530). The simulation can include performing optical rule checking (ORC) in order to tag or otherwise identify regions including structures that are not within predefined specification limits and/or marginally within predefined specification limits (i.e., potentially problematic regions). ORC can be performed based on one or more process-related parameters, also referred to as metrics. These process-related metrics can be indicative of the manufacturability of a layout or a portion thereof. In addition, portions of the layout can be identified based upon design attribute information, such as portions or regions of the layout that contain critical features. Further, it is to be appreciated that regions of interest within the layout can be identified based on analysis of the mask making process (i.e., fabrication of the reticle).

Once the regions of interest within the layout are identified (step 540), a coordinate list or site list corresponding to the regions of interest can be created at step 550. The coordinate or site list can include a table of coordinate locations of the regions of interest as well as corresponding windows or cells containing the regions of interest.

As described above with reference to FIG. 3, a clipped layout file or layout data set can be created based on the full device layout (and corresponding GDS data file) and the coordinate or site list. In one embodiment, software (such as the clip extractor 225 of FIG. 2), can operate on the full layout (and corresponding layout data set) by clipping or otherwise selectively extracting layout data from the full layout data set in order to create the clipped layout data file (also referred to as a clipped GDS file). In one embodiment, once the full device layout has been clipped, coordinates of every feature (e.g., every edge) within each clipped can be extracted and used in processing.

The clipped layout data set will be representative of a clipped layout, which includes portions of the layout identified at step 540 in coordinate locations corresponding to the coordinate list (step 550). All other space within the clipped layout (and corresponding clipped layout data file) will be blank or empty. As discussed above, FIG. 7 illustrates an exemplary full device or full chip layout 700, while FIG. 8 illustrates a corresponding exemplary clipped layout 800. As shown, the clipped layout 800 of FIG. 8 includes a plurality of regions of interest 810 assigned to locations as set forth in a corresponding exemplary coordinate list.

It is to be appreciated that steps 540, 550 and 560 can be thought of as representing a single step of creating or otherwise generating a metrology recipe (as discussed above with reference to FIG. 3). At step 570, the metrology recipe based on the clipped layout file and coordinate list can be converted (as discussed above with reference to FIG. 4) and transmitted or otherwise output to an appropriate metrology tool. In one embodiment, the metrology recipe can be transmitted along with simulation images of the identified regions of interest, which are present within the clipped layout file. In one embodiment, the metrology recipe can be created or otherwise generated for a scanning electron microscopy (SEM) tool as well as any other parametric electrical testing of the wafer (e.g., electrical line width testing) or reticle. Further, the metrology recipe can be created or otherwise generated for output to an optical metrology tool, which can include, but is not limited to, overlay metrology recipe generation (e.g., checking registration of multiple layers, e.g., contacts and gates and the alignment thereof), defect inspection tools (e.g., an optical comparator) and defect scan recipe tools. In addition, the metrology recipe can apply to reticle metrology (e.g., optical reticle metrology and acquisition of SEM images). In one embodiment, the metrology recipe can be generated for and applied to any type of microscopy testing, including, but not limited to atomic force microscopy (AFM), near field scanning optical microscopy (NSOM), magnetic force microscopy (MFM), scanning tunneling microscopy (STM), transmission electron microscopy (TEM) and scanning probe microscopy (SPM).

At step 580, experimental metrology results can be received based on the metrology recipe or request generated at step 570. As discussed above, the experimental metrology results can include a large number of SEM images, electrical line width experimental measurements, critical dimension measurements, other parametric electrical test measurements, optical measurements and the like (performed on either or both of the wafer and reticle).

At step 590, the experimental metrology results can be stored in a suitable database (such as the database 245 shown in FIG. 2) and linked to design data, layout data, OPC data (such as OPC model data) and/or simulation data (such as OPC and/or ORC results).

Figure 6:
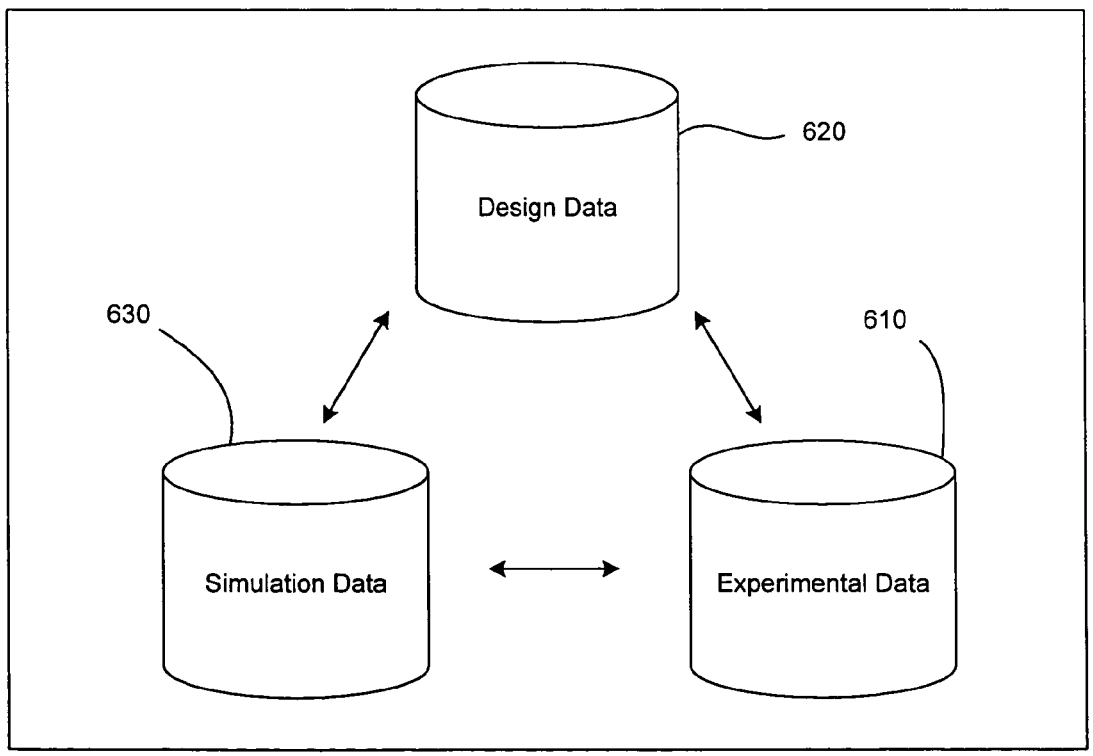
FIG. 6 is a schematic diagram illustrating a database system in which design data, simulation data and experimental data are linked in accordance with the present invention.

In one embodiment, the experimental metrology results 610 can be linked to the aforementioned design 620, layout, OPC and simulation data 630 through a queriable database system 245, 600 (illustrated schematically in FIG. 6). The queriable database system 600 can be queried by a user based on any of a number of experimental functions, including, but not limited to, mask design parameters (such as line width, pitch, mask type, density, lens location and orientation), exposure conditions (such as numerical aperture (NA), illuminator parameters, focus and energy or exposure) and process conditions (such as etch conditions, wafer stack and photoresist process conditions). It is to be appreciated that the various types of data (i.e., design data 620, simulation data 630 and experimental data 610) present during IC device design, manufacture and testing can be linked because of the metrology recipe generation techniques described herein.

For example, by creating a clipped layout data file, the coordinates and characteristics of the regions of interest (as well as the coordinates of the features within the regions of interest) are known with respect to the layout or physical representation of the device. Further, by transmitting the clipped layout data file and corresponding coordinate list to the metrology tool, experimental results received in response to the metrology request can be linked to the corresponding design, layout and simulation data. This is made possible by a central coordinate reference system that is consistent with whatever has been done upstream of the metrology request (i.e., device design, device layout, OPC and simulation and ORC).

The linking of this design, simulation and experimental information in a searchable database having process condition information, design attribute information and lithography condition information facilitates searching for optimality within the simulation results as well as the experimental results. As shown in FIG. 5, all of the information can be fed back to the respective design process (step 500) device layout process (step 510), OPC correction process (step 520) and simulation process (step 530) (and their respective databases) to improve each of the steps within the overall design process and allow for greater automation and design robustness.

It is to be appreciated that such a searchable or relational database may contain each metrology result (e.g., simulation and/or experimental/microscopy results) as a series of tables that enable tracking of a particular site on the wafer and reticle and in the design. In one embodiment, tables can be provided for the wafer map, reticle map and the site list. Tables that contain information about process conditions, (e.g., resist thickness, exposure energy, focus, scanner settings such as numerical aperture and wavelength) and microscope settings (e.g., for SEM—accelerating voltage, probe current, integration time/frames, scan rate, edge detection parameters). A table may also exist for the global alignment sites and addressing/pattern recognition sites.

Table 1 is an exemplary wafer map table that may contain the following headers and/or database table structure in, for example, a structured query language (SQL) database. Of course, other table structures and table types may be employed in any suitable language without departing from the scope of the present invention.

processing software 900 (which can be referred to as IMA software or application programming interface (API) software) can receive inputs, which include the recipe results 910 (i.e. experimental metrology results), the clipped GDS database 920, the corresponding coordinate or site list 930 as well as any necessary automatic measurement parameters 940. These inputs, which already reside in the queriable database system 245, 600, can be processed by the software 900 in order to provide outputs, which include, but are not limited to, addressing analysis reports 950, processed images 960 (e.g., SEM images) and appropriate measurement analysis reports 970 (e.g., collections of electrical parameters, such as electrical line width measurements). As described above, these processed images and/or measurements can be added to the queriable database and linked to other data sets, including design data, layout data, OPC data and simulation data for later use by a user or designer.

Although the illustrations appended hereto show a specific order of executing functional logic blocks, the order of execution of the blocks can be changed relative to the order shown. Also, two or more blocks shown in succession may be executed concurrently or with partial concurrence. Cer-

TABLE 1

| Tag | DataType | Description (Comment) | Example Record |
|---|---|---|---|
| WaferMapID | string | this is the ID (may be scanner job name) | DUVCGS_RED3_3 |
| WaferSize | floating point, mm | wafer size | 200 |
| WeeDistance | floating point, mm | this is the wee size (no measurements allowed in this region) | 3 |
| ImageID | string | string to describe each image. (each image could have different properties to build a general wafer map) | die |
| ReticleID | string | reticle ID associated with image number 1, wild cards allowed? (each image needs to come from some reticle) | DUVCGSK005A2 |
| OriginOffsetX | floating point | Offset vector x from center of wafer to lower left corner of origin chip | 0 |
| OriginOffsetY | floating point | Offset vector y from center of wafer to lower left corner of origin chip | 0 |
| ImageSizeX | floating point | size of image from scanner (this indicates position of masking blades, may be bigger than stepping pitch if chrome border is doing fine masking) | 15.5 |
| ImageSizeY | floating point | size of image from scanner (this indicates position of masking blades, may be bigger than stepping pitch if chrome border is doing fine masking) | 14 |
| SteppingPitchX | floating point | stepping distance of image array (this again sets masking blade positions) | 16.5 |
| SteppingPitchY | floating point | stepping distance of image array | 15 |
| ReticleOriginOffsetX | floating point | offset vector from center of reticle to center of image exposed (this again sets masking blade positions) | 0 |
| ReticleOriginOffsetY | floating point | offset vector from center of reticle to center of image exposed (this again sets masking blade positions) | 4.57 |
| OriginImageNumberColumn | integer | origin shot in array column number (origin is always lower left for counting) | 7 |
| OriginImageNumberRow | integer | origin shot in array row number (origin is always lower left for counting) | 7 |
| ImageArrayColumns | integer | number of shots in array x - number of columns | 12 |
| ImageArrayRows | integer | number of shots in array y - number of rows | 12 |
| NonExistImageList | blob | GSS file containing list of images that don't exist in this ImageID | nesl.txt |

Figure 9:
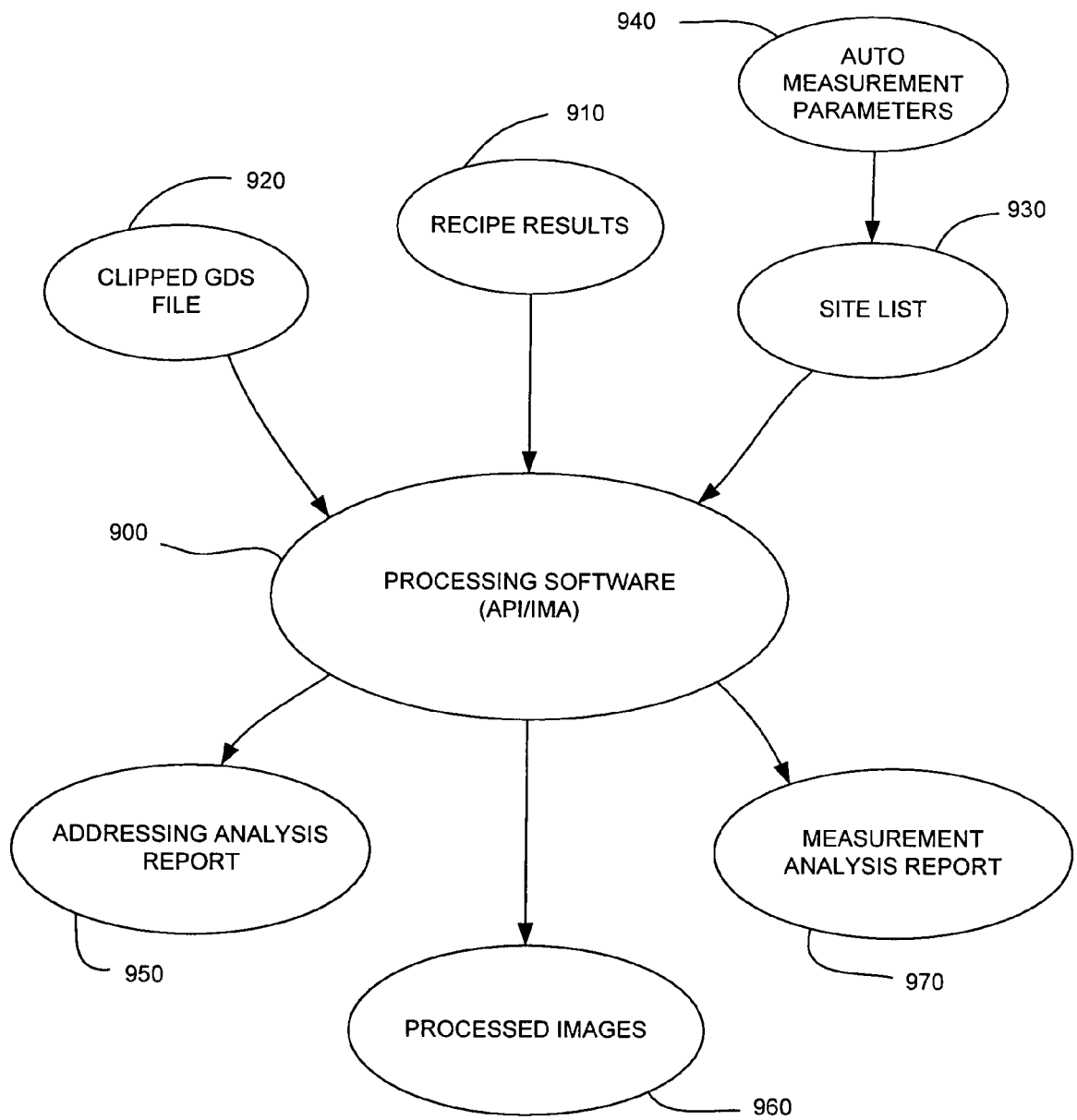
FIG. 9 is a schematic diagram illustrating an image metrology automation (IMA) post processing data flow in accordance with the present invention.

With reference now to FIG. 9, a schematic diagram illustrating an image metrology automation (IMA) post processing data flow is provided. As illustrated, appropriate tain blocks may also be omitted. In addition, any number of commands, state variables, warning semaphores, or messages can be added to the logical flow for purposes of enhanced utility, accounting, performance, measurement, or for providing troubleshooting aids, and the like. It is understood that all such variations are within the scope of the present invention.

Although particular embodiments of the invention have been described in detail, it is understood that the invention is not limited correspondingly in scope, but includes all changes, modifications and equivalents.

What is claimed is:

1. A method of generating a metrology recipe, the method comprising:
   identifying regions of interest within a device layout;
   creating a table of coordinates corresponding to the identified regions of interest;
   creating a clipped layout data file by selectively extracting layout data clips from a layout file representative of the device layout, wherein the clipped layout data file is representative of a layout having the identified regions of interest in locations corresponding to the coordinate table and wherein the remainder of the layout represented by the clipped layout file is empty; and
   outputting the clipped layout data file and the table of coordinates and at least a portion of the device layout to at least one metrology testing device.

2. The method of claim 1, further comprising:
   converting the at least a portion of the device layout and the table of coordinates into a metrology recipe.

3. The method of claim 1, further comprising:
   converting the clipped layout data file and the table of coordinates into a metrology recipe.

4. The method of claim 3, wherein the converting step includes:
   receiving at least one of text files and Extensible Markup Language (XML) files corresponding to the clipped layout data file and the table of coordinates; and
   converting the received files into a metrology recipe in a vendor proprietary binary format.

5. The method of claim 1, wherein the identifying step includes:
   simulating how the device layout will pattern on a wafer; and
   performing optical rule checking (ORC) on the simulated device layout.

6. The method of claim 5, wherein the identifying step includes:
   identifying structures within the simulated layout that are (i) not within predefined specification limits or (ii) marginally within predefined specification limits.

7. The method of claim 6, wherein the identifying step includes:
   identifying regions of the device layout that include test structures.

8. The method of claim 7, wherein the identifying step includes:
   identifying regions of the device layout based on design attribute information.

9. The method of claim 1, wherein the metrology testing device includes at least one of a microscopy device, an electrical metrology device and an optical metrology device.

10. The method of claim 9, wherein the metrology testing device tests at least one of wafer metrology and reticle metrology.

11. A method of generating a metrology recipe, the method comprising:
    identifying regions of interest within a device layout;
    creating a table of coordinates corresponding to the identified regions of interest;
    creating a clipped layout data file, by selectively extracting layout data clips from a layout file representative of the device layout, wherein the clipped layout data file is representative of a layout having the identified regions of interest in locations corresponding to the coordinate table and wherein the remainder of the layout represented by the clipped layout file is empty;
    performing a simulation of how the clipped regions of interest will pattern on a wafer; and
    outputting the simulation along with the clipped layout data file and table of coordinates to at least one metrology testing device.

12. A program embodied in a computer-readable medium, wherein when the program is loaded in memory on a computer and executed causes the computer to automatically generate a metrology recipe by:
    identifying regions of interest within a device layout;
    creating a table of coordinates corresponding to the identified regions of interest;
    creating a clipped layout data file, by selectively extracting layout data clips from a layout file representative of the device layout, wherein the clipped layout data file is representative of a layout having the identified regions of interest in locations corresponding to the coordinate table and wherein the remainder of the layout represented by the clipped layout file is empty; and
    converting the clipped layout data file and the table of coordinates into a metrology recipe;
    performing a simulation of how the clipped regions of interest will pattern on a wafer; and
    outputting the simulation along with the clipped layout data file and table of coordinates to at least one metrology testing device.

13. The program of claim 12, wherein the program causes the computer to:
    transmit the metrology recipe to at least one metrology testing device.

14. The program of claim 12, wherein the program causes the computer to:
    receive at least one of text files and Extensible Markup Language (XML) files corresponding to the clipped layout data file and the table of coordinates; and
    convert the received files into a metrology recipe in a vendor proprietary binary format.

15. The program of claim 12, wherein the program causes the computer to:
    receive experimental metrology results from at least one metrology tool based on the metrology recipe; and
    link the experimental metrology results to at least one of design data, layout data and simulation data in a queriable database.

16. A method of designing an integrated circuit (IC) device, said method comprising:
    generating a layout corresponding to an IC device design;
    simulating how structures within the layout will pattern on a wafer;
    identifying regions of interest within the layout;
    creating a coordinate list, said coordinate list corresponding to locations within the layout of each region of interest;
    creating a clipped layout file by selectively extracting layout data clips from a layout file representative of the device layout, wherein the clipped layout data file is representative of a layout having the identified regions of interest in locations corresponding to the coordinate table and wherein the remainder of the layout represented by the clipped layout file is empty;

converting the clipped layout file and the coordinate list into a metrology recipe;

sending the metrology recipe to at least one metrology tool;

receiving experimental metrology results from the at least one metrology tool based on the sent metrology recipe; and linking the experimental metrology results to at least one of design data, layout data and simulation data in a queriable database.

17. The method of claim 16, said method further comprising:

performing optical proximity corrections (OPC) on the layout.

18. The method of claim 17, said method further comprising:

using the experimental metrology results to provide feedback at least one of the layout, OPC and simulation steps.

19. The method of claim 16, wherein the step of identifying regions of interest includes, based on the simulating step, identifying regions of the simulated layout that include structures that are (i) not within predefined specification limits or (ii) marginally within predefined specification limits.

20. The method of claim 16, wherein the step of linking includes selectively storing the results in a queriable database system along with at least one of design data, layout data and simulation data.

21. The method of claim 16, wherein the metrology recipe includes instructions for at least one of microscopy, electrical metrology and optical metrology.

22. The method of claim 16, wherein the converting step includes converting files and lists into a customized binary format for automated metrology testing by the at least one metrology tool.

23. The method of claim 16, wherein the queriable database comprises a queriable database system for controlling and storing data related to integrated circuit (IC) device design and manufacture, the database system comprising:

design data, simulation data and experimental data that is stored and coordinated based on data indicative of a physical representation of the design data.

24. The method of claim 23, wherein the database system is queriable based on a plurality of experimental input functions.

25. The method of claim 24, wherein the experimental input functions include at least one of design parameters, mask design parameters, exposure conditions and process conditions.

* * * * *